United States Patent [19]

Aoki et al.

[11] 4,001,762
[45] Jan. 4, 1977

[54] THIN FILM RESISTOR

[75] Inventors: Teruaki Aoki, Tokyo; Hisayoshi Yamoto; Masanori Okayama, both of Hatano; Yoshimi Hirata, Atsugi; Shuichi Sato, Chofu; Takaaki Yamada, Atsugi, all of Japan

[73] Assignee: Sony Corporation, Tokyo, Japan

[22] Filed: June 2, 1975

[21] Appl. No.: 582,618

[30] Foreign Application Priority Data

June 18, 1974 Japan .............................. 49-69576

[52] U.S. Cl. ........................ 338/309; 338/314; 338/308; 357/23; 357/51; 357/59; 427/93; 427/95; 427/101
[51] Int. Cl.² ........................................ H01C 1/012
[58] Field of Search .................... 338/306–309, 338/314; 357/23, 51, 59; 29/571, 576, 590, 610, 620, 577; 427/93, 95, 101

[56] References Cited

UNITED STATES PATENTS

| | | | |
|---|---|---|---|
| 3,463,715 | 8/1969 | Bloom | 204/192 |
| 3,540,871 | 11/1970 | Dyer | 427/95 X |
| 3,619,739 | 11/1971 | Camenzind et al. | 357/51 |
| 3,629,667 | 12/1971 | Lubart et al. | 357/51 |
| 3,745,647 | 7/1973 | Boleky | 357/59 X |
| 3,806,361 | 4/1974 | Lehner | 357/59 X |
| 3,893,151 | 7/1975 | Bosselaun | 357/23 |

Primary Examiner—C. L. Albritton
Attorney, Agent, or Firm—Hill, Gross, Simpson, Van Santen, Steadman, Chiara & Simpson

[57] ABSTRACT

A thin film resistor is formed of polycrystalline silicon which contains 2 to 45 atomic percent of oxygen and wherein the resistivity of the polycrystalline silicon film varies as a function of the amount of oxygen contained in the film and wherein the resistivity is substantially higher than polycrystalline silicon not containing oxygen.

11 Claims, 10 Drawing Figures

THIN FILM RESISTOR

BACKGROUND OF THE INVENTION

1. Field of the Invention

This invention relates to a thin film resistor, and more particularly to a thin film resistor which has high resistivity and has superior temperature characteristics, and which is suitable for integrated circuits.

2. Description of the Prior Art

Resistors formed of carbon, metal and oxides are known. However, since these resistors have a relatively high conductivity, they must be extremely thin in order to obtain a high resistance. Moreover, since resistors have relatively low resistances, they must be made thin and narrow and complicated manufacturing processes are required to manufacture suitable resistors.

Resistors formed of single crystal silicon are known in which a P-type semiconductive region is formed in an N-type semiconductor substrate, and an N-type semiconductive region is formed in the P-type semiconductive region. Electrodes are arranged on opposite ends of the P-type semiconductive region which serves as a resistance region. However, the resistivity of the resistance region is very low, as for example, $10^2$ ohm/cm$^2$. The resistivity also changes with temperature as much as 0.5% per 1° C. The temperature coefficient of the resistor is positive within the range of the practical temperatures, and thus, the resistance increases as the temperature rises. Also, the linearity of the V-I characteristic of the device deteriorates due to the formation of the depletion layer.

A resistor formed of polycrystalline silicon is also known in which polycrystalline silicon is doped with boron atoms B or phosphorous atoms P to obtain a lower resistance than plain polycrystalline silicon. It has not been known to obtain a higher resistance than plain polycrystalline silicon prior to this invention. The resistivity of pure polycrystalline silicon is about $10^6$ ohm cm. It is therefore necessary with a resistor of pure polycrystalline silicon to have a narrow width in the order of 1μm to obtain a high resistance such as $10^{10}$ ohm/cm$^2$. A resistor is desired which has a resistivity between $10^{3\sim4}$ to $10^{8\sim16}$ ohm cm preferably in the range between $10^6$ to $10^{12}$ ohm cm. The resistivity of $SiO_2$ is about $10^{12\sim14}$ ohm cm. It is very difficult however, to obtain a high resistance in such range. Although it has previously been known how to lower the resistivity of polycrystalline silicon, it has not been known prior to our invention how to raise the resistivity of polycrystalline silicon.

Resistors formed of polycrystalline silicon can be used as the gate resistor for a resistance-gate type field effect transistor (SRG-FET). Boron atoms B or phosphorous atoms P can be diffused into the contact portion between a gate electrode and the gate resistor to provide good ohmic contact. However, an amplifier and a capacitor are required for applying drain signals to the gate electrode. The distortion factorfrequency characteristics of the SRG-FET can be determined by the capacitance Co of the capacitor and the resistance Rg of the gate resistor. With a time constant CoRg larger than the period 1/f of the signals frequency, the distortion factor will descrease. When the time constant CoRg is smaller than the period 1/f, the distortion factor will increase. The distortion factor can be improved by increasing the capacitance Co, however, operation of the SRG-FET is difficult because units such as an amplifier and a capacitor are required.

An SRG-FET is proposed in which a polycrystalline silicon film is formed on a $SiO_2$ film to increase the breakdown voltage of a transistor, and in which a depletion layer is broadened by the electrical field from the polycrystalline silicon film. However, such transistor has a disadvantage in that electrical charges pass through the polycrystalline silicon film and generate a reverse leakage current.

SUMMARY OF THE INVENTION

An object of this invention is to provide a thin film resistor which can be adjusted to a desirable high resistance.

Another object of this invention is to provide a thin film resistor so as to improve the distortion factor of an SRG-FET.

A further object of this invention is to provide a thin film resistor which simplifies the construction of a SRG-FET.

A still further object of this invention is to provide a thin film resistor which has a superior V-I characteristics and a superior temperature characteristics, The foregoing and other object features and advantages of the invention will be apparent from the following more particular description of preferred embodiments of the invention, as illustrated in the accompanying drawings.

DESCRIPTION OF THE PREFERRED EMBODIMENTS

One embodiment of this invention as applied to a thin film resistor on a semiconductor substrate will be described with reference to FIG. 1 through FIG. 5.

Figure 1:
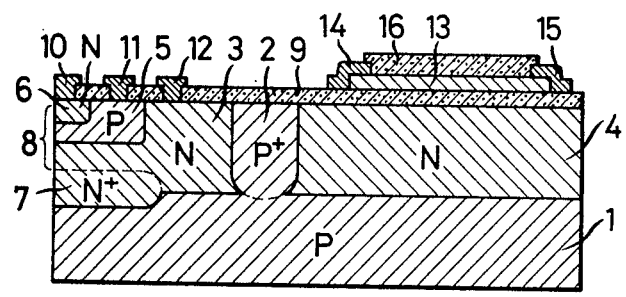
FIG. 1 is a cross-sectional view of one embodiment of this invention, applied to a semiconductor device.
Figure 2:
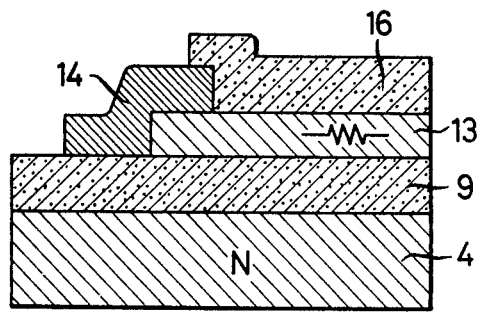
FIG. 2 is an enlarged cross-sectional view of a part of the semiconductor device of FIG. 1.

Referring to FIG. 1, N-type semiconductive regions 3 and 4 are separated from each other by a P$^+$-type semiconductive region 2 in a P-type semiconductor substrate 1. A P-type semiconductive region 5 is formed in the N-type semiconductive region 3, and an N-type semiconductive region 6 is formed in the P-type semiconductive region 5. An NPN type transistor 8 is therefore formed in the semiconductor substrate 1. An N$^+$-type semiconductive region 7 is formed in the N-type semiconductive region 3 as shown. A $SiO_2$ film 9 is deposited on the semiconductor substrate 1. Openings are formed in the SiO film 9, and these are filled with an emitter electrode 10, a base electrode 11 and a collector electrode 12, respectively. A film 13 of polycrystalline silicon containing oxygen is deposited on the SiO$_2$ film 9 over the N-type semiconductive region 4. Electrodes 14 and 15 are formed on opposite ends of the film 13 of polycrystalline silicon containing oxygen. The upper surface of the film 13 is covered with a SiO$_2$ film 16. A contact portion between at least one of the electrodes 14 and 15 and the film 13 is doped with boron atoms B or phosphorus atoms P at a predetermined concentration of over $10^{20}$ atoms/cm$^3$, to provide good ohmic contact.

In the above-mentioned construction, the polycrystalline silicon film 13 is used as a resistance element. The film 13 of polycrystalline silicon uniformly contains 2 to 45 atomic percent of oxygen and as a specific examply may contain 27 atomic percent of oxygen. Grain sizes of polycrystalline silicon vary from 100 A to hundreds of A. Each grain comprises an intrinsic semiconductor containing silicon with a concentration of $10^{13}$ to $10^{14}$ atoms/cm$^3$ and with oxygen atoms uniformly dispersed into the intrinsic semiconductor. Grain boundaries abundant in oxygen atoms are formed between the grains. The grain sizes may be 100 A to 1$\mu$. A polycrystalline silicon grain having a size over 1$\mu$ is similar to a single crystal of silicon. The thermal growth rate of polycrystalline silicon having grain sizes under 100 A is very slow. Accordingly, polycrystalline silicon having grain sizes outside the range of 100 A to 1$\mu$ is undesirable. The polycrystalline film may be 100 A to a number of microns thick.

The resistance of the polycrystalline silicon containing oxygen atoms at the above-mentioned concentrations is higher than that of the pure polycrystalline silicon which contains no oxygen atoms.

The relationship between the resistance and energy bands will be described with reference to FIG. 3A through FIG. 3D.

Figure 3A:
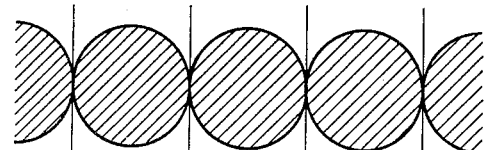
FIG. 3A is a schematic view showing the arrangement of polycrystalline silicon grains.
Figure 3B:
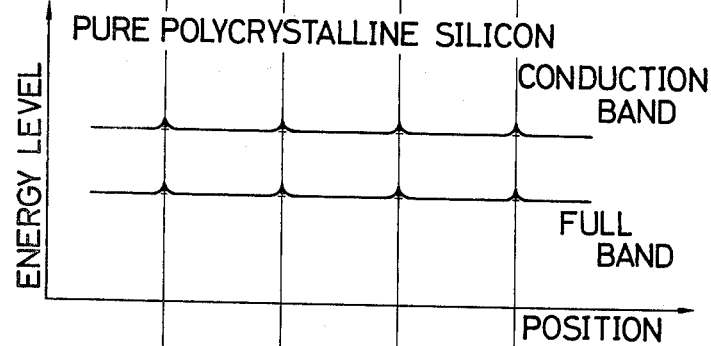
FIG. 3B is an energy band diagram for pure polycrystalline silicon.
Figure 3C:
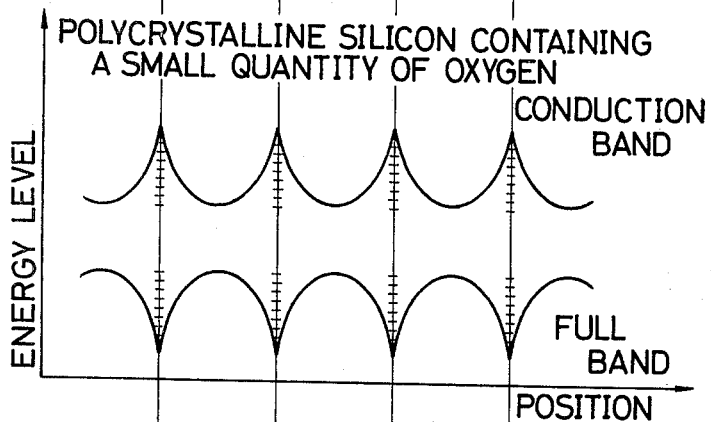
FIG. 3C is an energy band diagram for polycrystalline silicon containing a small quantity of oxygen.

FIG. 3A shows the arrangement of the grains of polycrystalline silicon in the polycrystalline silicon film 13. The gap between the energy level within the grain and the energy level at the grain boundary is not so large in the pure polycrystalline silicon (shown in FIG. 3B) as it is in polycrystalline silicon containing oxygen (shown in FIG. 3C). The resistivity of pure polycrystalline silicon is as small as $10^6$ohm-cm, although trap levels exist. When a small quantity of oxygen atoms is added to the pure polycrystalline silicon, SixO$_y$ compounds are locally formed at the grain boundaries. Accordingly, the energy levels are raised at the grain boundaries as shown in FIG. 3C. The movement of carriers (electrons or holes) is barred by the energy barrier at the grain boundaries in the polycrystalline silicon, and the carriers are caught by the traps and fill the trap levels. For this reason, the resistivity of the polycrystalline silicon film greatly increases.

Figure 3D:
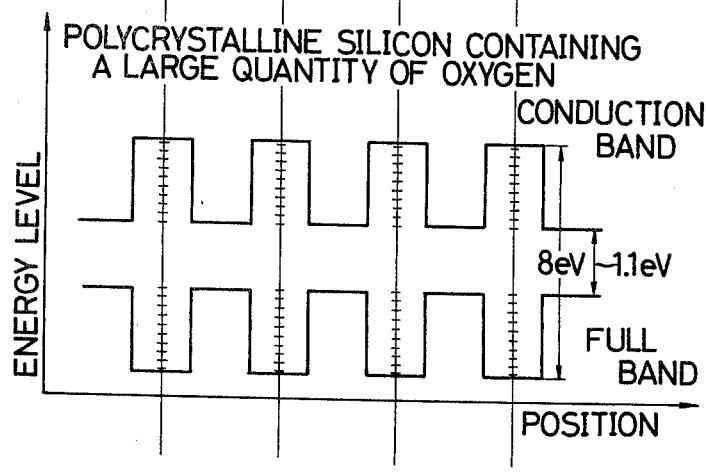
FIG. 3D is an energy band diagram for polycrystalline silicon containing a large quantity of oxygen.

When a large quantity of oxygen atoms is added into pure polycrystalline silicon, the energy gap further increases ($\Delta E \approx$ 8eV) and the width of the energy barrier further increases as shown in FIG. 3D. When the width of the energy barrier is under 30A, the carriers can only partly pass through the energy barrier due to tunnel effect.

A method for forming the polycrystalline silicon film 13 will now be described.

The semiconductor substrate is heated and maintained at 600° – 800° C. A nitrogen gas as a carrier gas and a mixed gas of SiH$_4$ and N$_2$O are caused to concurrently flow over the semiconductor substrate. The SiH$_4$ thermally decomposes, and polycrystalline silicon is deposited on the semiconductor substrate and at the same time oxygen atoms from the N$_2$O are nearly uniformly dispersed into the polycrystalline silicon. The resistivity of the thermally grown polycrystalline silicon film can be controlled with the variation of the ratio of N$_2$O to SiH$_4$. The resistivity can be varied from $10^6$ ohm-cm which is the resistivity of pure polycrystalline silicon, to $10^{12}$ ohm-cm which is the resistivity of SiO$_2$. Table I shows the relationship between the ratio of N$_2$O to SiH$_4$ and the oxygen concentration.

TABLE I

| Ratio of N$_2$O to SiH$_4$ | Concentration of Oxygen (atomic %) | Resistivity (ohm-cm) |
| --- | --- | --- |
| 0 | 2 | $3 \times 10^6$ |
| 1/3 | 26.8 | $3 \times 10^9$ |
| 2/3 | 34.8 | $5 \times 10^{10}$ |
| 3/3 | 36.4 | $1 \times 10^{11}$ |

Figure 4:
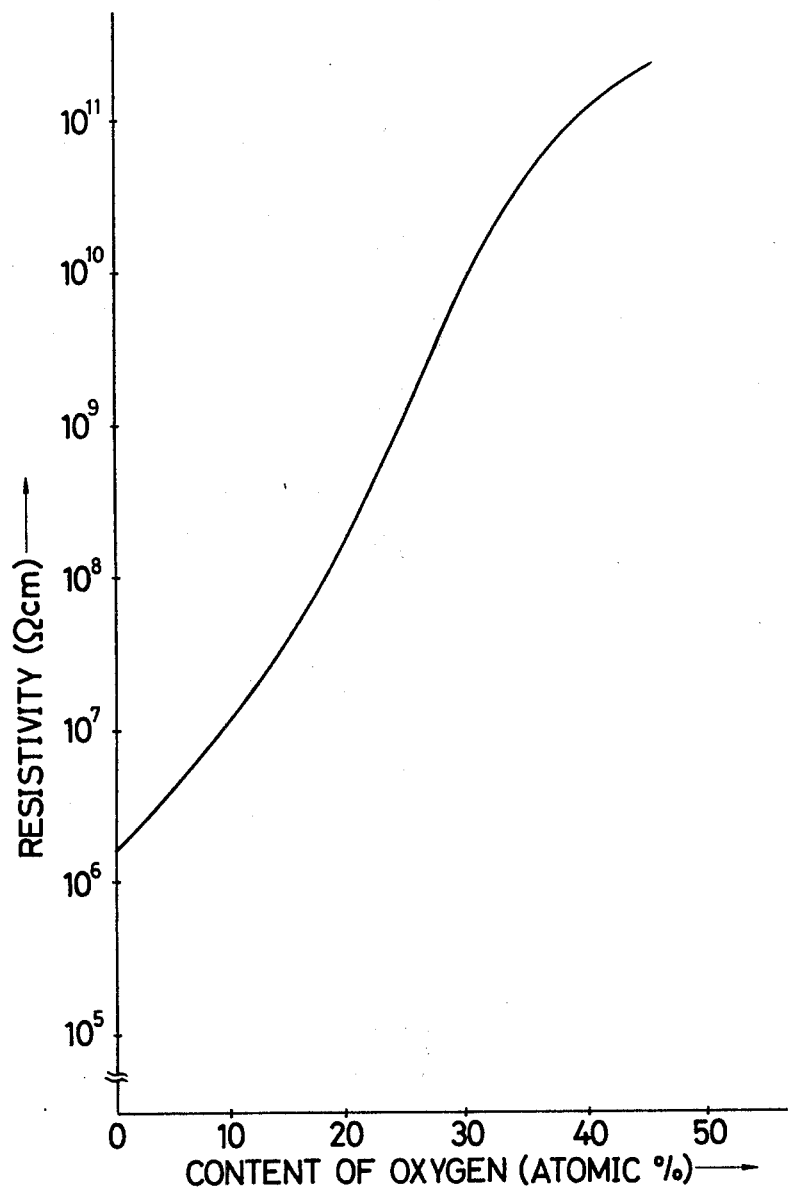
FIG. 4 is a graph showing the relationship between the content of oxygen and the resistivity.

FIG. 4 is a graph showing the relationship between the resistivity and the content of oxygen in atomic percent. By varying the flow ratio of N$_2$O to SiH$_4$, the oxygen concentration and the resistivity can be controlled.

Figure 5:
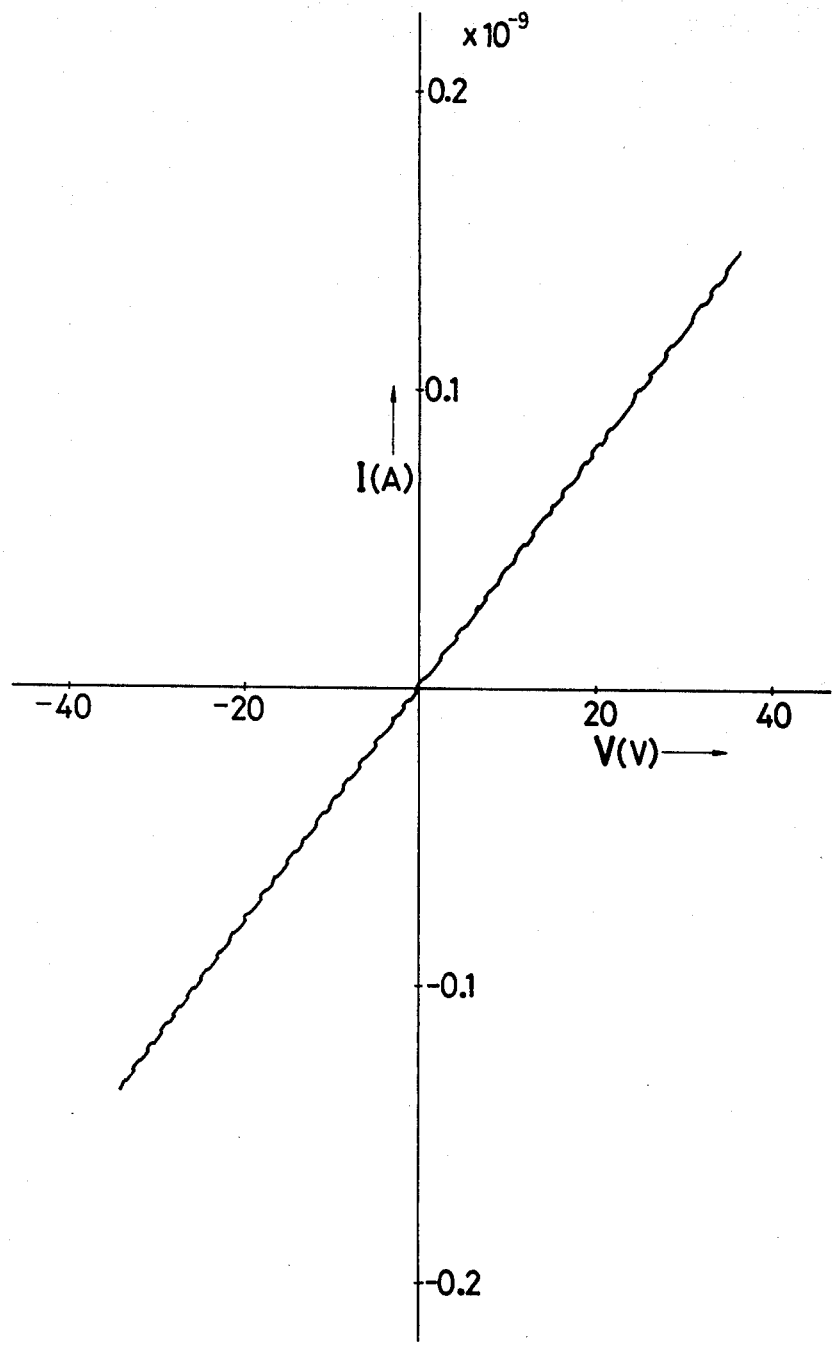
FIG. 5 is a graph showing the V-I characteristics of a polycrystalline silicon film.

FIG. 5 illustrates the V-I characteristic as measured between the electrodes 14 and 15 of the thin film resistor 13 for the ratio of N$_2$O to SiH$_4$=⅓, where the contact portion of the thin film resistor 13 is doped with boron atoms at a concentration of $10^{20}$atoms/cm$^3$. As apparent from FIG. 5, the thin film resistor 13 has a superior V-I characteristic which is linear and good ohmic contact exists. The temperature variation V-I characteristics were very good.

Another embodiment of this invention as applied to an SRG-FET will be described with reference to FIG. 6 and FIG. 7.

Figure 6:
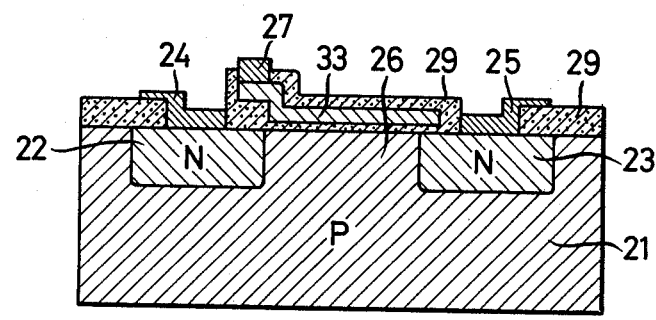
FIG. 6 is a cross-sectional view of another embodiment of this invention, applief to an SRG-FET.

Referring to FIG. 6, an N-type semiconductive region 22 as a source region and another N-type semi-conductive region 23 as a drain region are formed in a P-type semiconductor substrate 21. Openings are made in a SiO$_2$ film 29 and are filled with a source electrode 24 and a drain electrode 25. A film of polycrystalline silicon containing oxygen as described in the first embodiment is surrounded by the SiO$_2$ film 29 and is formed so as to extend over the channel 26 between the source region 22 and the drain region 23. An opening is made in the SiO$_2$ film which surrounds the polycrystalline silicon film 23 and a gate electrode 27 is formed therein. The gate electrode 27 is in ohmic contact with the film 33 of polycrystalline silicon containing oxygen. The normal electrical conductors to the electrodes 24, 25 and 27, and an electrode formed on the lower surface of the semiconductor substrate 21 are not shown as these are conventional and well known.

The SRG-FET operates as follows.

The cut-off frequency $f$ of the SRG-FET is expressed by the equation:

$$f = \frac{1}{2 C_g R_g}$$

where $C_g$ is the capacitance between the film 33 of polycrystalline silicon containing oxygen and the channel 26, and $R_g$ is the resistance of the polycrystalline silicon film 33 in the direction of the channel 26. When signals are applied to the source 24 and drain 25 and a control voltage is applied to the gate electrode 27, a potential gradient exists in the polycrystalline silicon film 33 due to coupling between the polycrystalline silicon film 33 and the N-type semiconductor substrate 23, and the capacitance $Cg$ will locally change. This causes the linearity of the V-I characteristics between the source and drain to be improved and it is possible to prevent the pinch-off effect which occurs in conventional FETS from occurring. In other words, since the resistance Rg of film 33 of polycrystalline silicon containing oxygen is higher than polycrystalline not containing oxygen, the cut-off frequency $f$ can be lowered with the invention and the signal-followability of the gate will be avoided with the invention. Also, the resistivity of the film 33 of the invention is locally uniform and homogeneous. The resistance of the channel can be controlled by the supply voltage or by the DC component from the gate electrode. Thus, the SRG-FET according to this invention can be used as a variable impedance element.

Since signals are applied to the source-drain in the present invention the capacitor required for conventional FETs can be eliminated. The gate of the present invention can be operated with a single terminal. Thus, the FET according to this invention is much simpler than those of the prior art.

Figure 7:
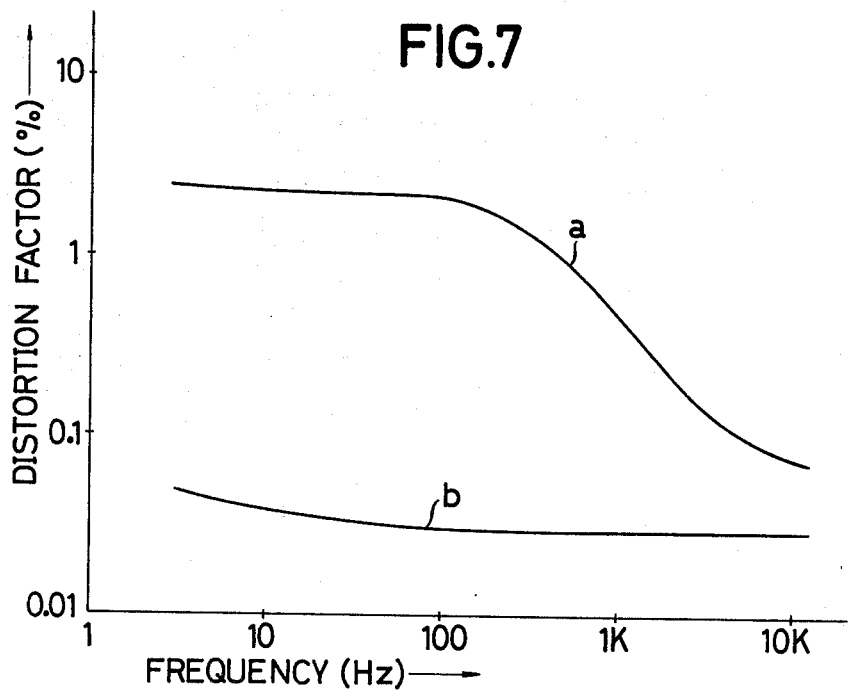
FIG. 7 is a graph showing the distortion factor-frequency characteristics of the SRG-FET of FIG. 6.

In the present invention, since the resistance Rg can be greatly increased, the distortion factor can be greatly improved, as shown in FIG. 7. In FIG. 7, curves $a$ and $b$ show the relationships between distortion factor and the frequency. Curve $a$ is for pure polycrystalline silicon and curve $b$ is for polycrystalline silicon containing 26.8 percent oxygen formed with the ratio of $N_2O$ to $SiH_4=\frac{1}{3}$ in FETs and are used for the gates. The distortion factors were measured in each case in the condition of feedback through the electrode formed on the lower surface of the semiconductor substrate 21. The distortion factor of the SRG-FET according to this invention proved to be reduced to about one hundredth of the distortion factor of the conventional FET at lower frequencies under about 1 KH$_z$. It is possible to reduce the distortion factor to about one thousandth by controlling the content of the polycrystalline silicon.

The distortion factors at the lower frequencies were improved over conventional FET. With this invention the distortion factor can be improved using same methods of construction as for the conventional FETs and only the addition of oxygen to the polycrystalline silicon differs from the prior art techniques. The improved results can be obtained without substantially changing the manufacturing methods used for construction of conventional FETs.

Although the preferred embodiments of this invention have been described, it will be understood that various modifications of the invention can be made.

For example, it is possible to vary the shape and size of the thin film resistor of polycrystalline silicon containing oxygen. In order to prevent breakdown in a transistor, the thin film resistor may be formed on the SiO$_2$ film or directly on the semiconductor substrate adjacent to the PN junction between the base and collector. In that case, since the thin film resistor has a high resistance, reverse leakage current will not flow.

According to this invention, since the thin film resistor is formed of polycrystalline silicon containing oxygen in the range between 2 to 45 atomic percent, the resistivity of the resistor can be greatly increased as compared to pure polycrystalline silicon. For example, the resistance can be adjusted within the range from $10^6$ to $10^{12}$ ohm-cm. Also, the V-I characteristics of the resistor will be greatly improved over resistors made of pure polycrystalline silicon.

As shown by FIG. 4 and Table I the resistivity of polycrystalline silicon can be varied over the range from $10^6$ ohm-cm to $10^{12}$ ohm-cm by varying the atomic percent of oxygen from 2 to 45 percent. Note in FIG. 4 that 10 percent oxygen gives a resistivity of about $10^7$ ohm-cm, 20 percent oxygen gives a resistivity of $10^8$ ohm-cm, 30 percent oxygen gives about $10^{10}$ ohm-cm and 36.4 percent oxygen gives $10^{11}$ ohm-cm. Table I also gives specific resistivity values. It is seen that any desired value of resistivity between $10^6$ ohm-cm to $10^{12}$ ohm-cm can be obtained by varying the atomic percentage of oxygen in polycrystalline silicon.

Although the entire range between 2 to 45 percent oxygen is disclosed there is a preferred range between 10 to 35 percent oxygen. Another preferred range is between 20 to 30 percent. Another preferred range is between 25 to 35 percent. Yet another preferred range is between 25 to 30 percent.

When donor impurities or acceptor impurities in concentrations over $10^{19}$ atoms/cm$^3$ are added into the polycrystalline silicon containing oxygen, the temperature coefficient of the resistor will be greatly reduced, and the temperature characteristics will be improved. Concentrations of impurities under $10^{19}$ atoms/cm$^3$ is undesirable, since this will cause the temperature characteristics to deteriorate.

When this invention is applied to a FET having a resistance gate, the distortion factor will be greatly improved due to the increase of the resistance caused by the oxygen and the number of external circuit elements requuired for the conventional FET are decreased and thus construction and operation are simplified.

Although this invention has been described with respect to preferred embodiments it is not to be so limited as changes and modifications may be made therein which are within the full intended scope as defined by the appended claims.

We claim as our invention:
1. A thin film resistor comprising:
   a supporting member,
   a polycrystalline silicon film containing oxygen in the range between 2 to 45 atomic percent formed on said supporting member, and
   electrical contacts formed on spaced portions of said polycrystalline silicon film.
2. A thin film resistor according to claim 1, wherein an insulating layer is formed on said supporting member and said polycrystalline silicon film is formed on said insulating layer.
3. A thin film resistor according to claim 2, wherein said insulating layer is silicon dioxide.
4. A thin film resistor according to claim 1, wherein said polycrystalline silicon film contains oxygen in the range between 10 to 35 atomic percent.
5. A thin film resistor according to claim 1 wherein said polycrystalline silicon film contains oxygen in the range between 20 to 30 atomic percent.
6. A thin film resistor according to claim 1 wherein said polycrystalline silicon film contains oxygen in the range between 25 to 35 atomic percent.

7. A thin film resistor according to claim 1 wherein said polycrystalline silicon film contains oxygen in the range between 25 to 30 atomic percent.

8. A thin film resistor according to claim 2, including a second electrical contact connected to a second portion of said polycyrstalline silicon film and said first and second portions spaced apart from each other.

9. A thin film resistor comprising:
   a supporting member having silicon substrate and silicon dioxode formed on said silicon substrate,
   a polycrystalline silicon film containing oxygen in the range between 2 to 45 atomic percent formed on said silicon dioxide.
   an electrical contact connected to one portion of said polycrystalline silicon film, and
   said one portion of said polycrystalline silicon film doped with impurity in order to make an ohmic contact.

10. A thin film resistor according to claim 9, wherein a silicon dioxide film is formed over said polycrystalline silicon film containing oxygen in the range between 2 to 45 atomic percent.

11. A thin film resistor according to claim 9, wherein a silicon dioxide film is formed over said polycrystalline silicon film containing oxygen in the range between 2 to 45 atomic percent.

* * * * *